United States Patent
Lee et al.

(10) Patent No.: US 7,851,789 B2
(45) Date of Patent: *Dec. 14, 2010

(54) PHOTOSENSITIVE RESIN COMPOSITION FOR PAD PROTECTIVE LAYER, AND METHOD FOR MAKING IMAGE SENSOR USING THE SAME

(75) Inventors: Kil-Sung Lee, Gwacheon-si (KR); Jae-Hyun Kim, Seongnam-si (KR); Chang-Min Lee, Goyang-si (KR); Eui-June Jeong, Seoul (KR); Kwen-Woo Han, Seoul (KR); O-Bum Kwon, Seoul (KR); Jung-Sik Choi, Seoul (KR); Jong-Seob Kim, Seoul (KR); Tu-Won Chang, Seoul (KR); Jung-Hyun Cho, Suwon-si (KR); Seul-Young Jeong, Suwon-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/329,650

(22) Filed: Dec. 8, 2008

(65) Prior Publication Data
US 2009/0146236 A1    Jun. 11, 2009

(30) Foreign Application Priority Data
Dec. 7, 2007    (KR) ................. 10-2007-0127078

(51) Int. Cl.
*H01L 35/24*    (2006.01)
(52) U.S. Cl. ................. 257/40; 257/184; 257/187; 257/292; 257/E39.001

(58) Field of Classification Search ............ 257/40, 257/184, 187, 292
See application file for complete search history.

(56) References Cited

U.S. PATENT DOCUMENTS

| 5,362,697 | A | * | 11/1994 | Fung et al. ............... 502/71 |
| 5,631,703 | A |   | 5/1997 | Hamilton, Jr. et al. |
| 5,854,091 | A |   | 12/1998 | Back et al. |
| 2006/0280878 | A1 | * | 12/2006 | Suezaki et al. ............ 428/1.1 |
| 2007/0210395 | A1 | * | 9/2007 | Maruyama et al. .......... 257/431 |
| 2009/0208854 | A1 | * | 8/2009 | Choi et al. ................. 430/9 |

FOREIGN PATENT DOCUMENTS

| JP | 7-172032 | 7/1995 |
| JP | 7-235655 | 9/1995 |
| JP | 10-066094 | 3/1998 |
| JP | 11-354763 | 12/1999 |
| JP | 2004-341121 | 12/2004 |

(Continued)

*Primary Examiner*—Wai-Sing Louie
(74) *Attorney, Agent, or Firm*—Summa, Additon & Ashe, P.A.

(57) ABSTRACT

The present invention provides a photosensitive resin composition for a pad protective layer that includes (A) an alkali soluble resin, (B) a reactive unsaturated compound, (C) a photoinitiator, and (D) a solvent. The (A) alkali soluble resin includes a copolymer including about 5 to about 50 wt % of a unit having the Chemical Formula 1, about 1 to about 25 wt % of a unit having the Chemical Formula 2, and about 45 to about 90 wt % of a unit having the Chemical Formula 3, and a method of making an image sensor using the photosensitive resin composition.

15 Claims, 3 Drawing Sheets

FOREIGN PATENT DOCUMENTS

| | | |
|---|---|---|
| JP | 2005-278213 | 10/2005 |
| KR | 1998-056215 B1 | 5/1999 |
| KR | 2002-039125 A | 5/2002 |
| KR | 2003-002899 A | 1/2003 |
| KR | 2003-056596 A | 7/2003 |
| KR | 1020030075890 A | 9/2003 |
| KR | 1020050077345 A | 8/2005 |
| KR | 2006-0052171 A | 5/2006 |
| KR | 1020070007016 A | 1/2007 |
| KR | 1020070021966 A | 2/2007 |
| KR | 2007-0033748 A | 3/2007 |
| KR | 100793946 B1 | 1/2008 |

* cited by examiner

PHOTOSENSITIVE RESIN COMPOSITION FOR PAD PROTECTIVE LAYER, AND METHOD FOR MAKING IMAGE SENSOR USING THE SAME

CROSS-REFERENCE TO RELATED APPLICATION

This application claims priority to and the benefit of Korean Patent Application No. 10-2007-0127078 filed in the Korean Intellectual Property Office on Dec. 7, 2007, the entire content of which is incorporated herein by reference.

FIELD OF THE INVENTION

The present invention relates to a composition for a pad protective layer, and a method of making an image sensor using the same.

BACKGROUND OF THE INVENTION

An image sensor is a device including several million elements for transforming light into an electrical signal depending upon the intensity of radiation when it receives the light. The image sensor is installed in a digital input device, which enables recording of pre-digitalized images to digitalized images. Recently, the need for these devices has remarkably increased for use in various security devices and digital photos.

The image sensor is composed of a pixel array, which is a plurality of pixels arranged in a two-dimensional matrix format. Each pixel includes photosensitive means and transmission and signal output devices. Depending upon the transmission and signal output devices, the image sensor is broadly classified into two kinds: a charge coupled device (CCD) type of image sensor and a complementary metal oxide semiconductor (CMOS) type of image sensor.

In the image sensor, a color filter separates light coming from the outside into red, green, and blue and transmits the separated light to a corresponding photodiode in each pixel.

FIG. 1 is a schematic cross-sectional view of a structure of a conventional complementary metal oxide semiconductor (CMOS) image sensor. Hereinafter, the structure of conventional complementary metal oxide semiconductor (CMOS) image sensor 100 is described with reference to FIG. 1. The light coming from the outside reaches a color filter 150 through a microlens 110 and a second overcoating layer 130, is separated at the color filter 150 into each of red, green, and blue (R, G, and B), and is then transmitted to a photodiode 113 corresponding to each pixel formed between metal layers 180 on an interlayer dielectric layer 115 through a first overcoating layer 170 and a passivation layer 190. A pad 160 is formed to connect to the photodiode 113 in order to draw the signal from the image sensor 100.

Much research directed to new processes and related materials has been undertaken to produce an image sensor. In particular, research is actively focusing on improvements in display quality of minute pixels with sizes decreasing from 3 to 5 μm to 1 μm. Due to the small pixel size of 1 μm or less, a geometric optical aspect and a wave optical aspect toward the microlens have to be considered at a level of 1.5 times the visible ray wave length.

Further, as the unit pixel becomes smaller, the diameter of the microlens becomes smaller. As a result, the crosstalk phenomenon with an adjacent pixel more easily occurs unless the focal distance of the lens is decreased, which can deteriorate resolution. In order to solve this problem, the thickness of each layer formed between the photodiode and the microlens can be decreased. In addition, Korean Patent Laid-Open Publication No. 2007-0033748 is directed to a production method which does not form an upper overcoating layer.

Other image sensors and methods for making the same are disclosed in many patents, such as Korean Patent Laid-Open Publication No. 2002-039125, Japanese Patent Laid-Open Publication No. Pyong 10-066094, Korean Patent Laid-Open Publication No. 1998-056215, Japanese Patent Laid-Open Publication No. Pyong 7-235655, Korean Patent Laid-Open Publication No. 2003-056596, Japanese Patent Laid-Open Publication No. 2005-278213, Korean Patent Laid-Open Publication No. 2003-002899, and Japanese Patent Laid-Open Publication No. Pyong 11-354763.

Korean Patent Laid-Open Publication No. 2006-0052171 provides a fine pattern of 2.0×2.0 μm using a dye in order to obtain a high density pixel, as in Japanese Patent Laid-Open Publication No. 2004-341121. However, a dye is used as a colorant instead of a pigment in this method. The dye has problems relating to long term reliability because the photoresistance or thermal resistance and other properties thereof can deteriorate.

In addition, Japanese Patent Laid-Open Publication No. P7-172032 is directed to the use of a black matrix in order to prevent the colors of red, green, and blue from mixing and dislocating. However, this method also requires an additional process; it is almost impossible to make a fine black matrix; and in addition, the aperture ratio is decreased by introducing the black matrix.

SUMMARY OF THE INVENTION

One embodiment of the present invention provides a photosensitive resin composition for a pad protective layer having excellent patterning and etching performance, and chemical resistance, that can enable production of an image sensor without a lower overcoating layer.

Another embodiment of the present invention provides a method of making a high resolution image sensor that does not have a lower overcoating layer of a conventional image sensor resulting in a decreased focal distance of a lens.

The embodiments of the present invention are not limited to the above technical purposes, and a person of ordinary skill in the art can understand other technical purposes.

According to one embodiment of the present invention, a photosensitive resin composition for a pad protective layer is provided that includes (A) an alkali soluble resin, (B) a reactive unsaturated compound, (C) a photoinitiator, and (D) a solvent. The (A) alkali soluble resin includes a copolymer including about 5 to about 50 wt % of a unit having the following Chemical Formula 1, about 1 to about 25 wt % of a unit having the following Chemical Formula 2, and about 45 to about 90 wt % of a unit having the following Chemical Formula 3.

[Chemical Formula 1]

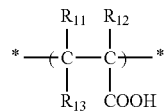

In the above Formula 1, $R_{11}$, $R_{12}$, and $R_{13}$ are each independently selected from the group consisting of hydrogen, substituted or unsubstituted alkyl, substituted or unsubstituted cycloalkyl, substituted or unsubstituted aryl, and substituted or unsubstituted heteroaryl.

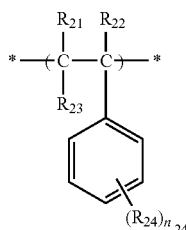

[Chemical Formula 2]

In the above Formula 2, $R_{21}$, $R_{22}$, and $R_{23}$ are each independently selected from the group consisting of hydrogen, substituted or unsubstituted alkyl, substituted or unsubstituted cycloalkyl, substituted or unsubstituted aryl, and substituted or unsubstituted heteroaryl, each $R_{24}$ is independently selected from the group consisting of substituted or unsubstituted alkyl, substituted or unsubstituted cycloalkyl, substituted or unsubstituted aryl, substituted or unsubstituted heteroaryl, and substituted or unsubstituted alkoxy, and $n_{24}$ is an integer ranging from 0 to 5.

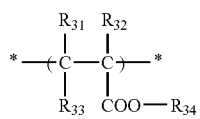

[Chemical Formula 3]

In the above Formula 3, $R_{31}$, $R_{32}$, and $R_{33}$ are each independently selected from the group consisting of hydrogen, substituted or unsubstituted alkyl, substituted or unsubstituted cycloalkyl, substituted or unsubstituted aryl, and substituted or unsubstituted heteroaryl, and $R_{34}$ is selected from the group consisting of substituted or unsubstituted alkyl, substituted or unsubstituted cycloalkyl, substituted or unsubstituted aryl, and substituted or unsubstituted heteroaryl.

The (A) alkali soluble resin includes about 5 to about 50 wt % of a unit of the above Chemical Formula 1, about 1 to about 25 wt % of a unit of the above Chemical Formula 2, and about 45 to about 90 wt % of a unit of the above Chemical Formula 3.

In one embodiment, the photosensitive resin composition includes about 1 to about 50 wt % of the (A) alkali soluble resin, about 1 to about 50 wt % of the (B) reactive unsaturated compound, (C) about 0.1 to about 15 wt % of the photoinitiator, and (D) the balance of the solvent. In another embodiment, the solvent is included in an amount of about 1 to about 95 wt %.

The (A) alkali soluble resin may be a copolymer further including a unit having the following Formula 4.

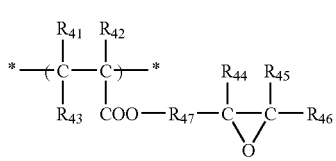

[Chemical Formula 4]

In the above Formula 4, $R_{41}$, $R_{42}$, $R_{43}$, $R_{44}$, $R_{45}$, and $R_{46}$ are each independently selected from the group consisting of hydrogen, substituted or unsubstituted alkyl, substituted or unsubstituted cycloalkyl, substituted or unsubstituted aryl, and substituted or unsubstituted heteroaryl, and $R_{47}$ is selected from the group consisting of substituted or unsubstituted alkylene, substituted or unsubstituted cycloalkylene, substituted or unsubstituted arylene, and substituted or unsubstituted heteroarylene.

The alkali soluble resin (A) can include the unit of Formula 4 in an amount of about 20 wt % or less, based on the total weight of the alkali soluble resin.

The unit of Formula 2 can be derived from a styrene.

The unit of Formula 3 can be derived from a compound selected from the group consisting of dicyclo-pentanyl(meth)acrylate, isobornyl (meth)acrylate, stearyl (meth)acrylate, and combinations thereof.

According to another embodiment of the present invention, a method of making an image sensor is provided. The method of the invention includes: forming a photodiode, a pad, and a passivation layer on an interlayer insulating layer (interlayer dielectric layer) and removing the passivation layer on the pad to expose the pad; forming a pad protective layer on the exposed pad using the photosensitive resin composition of the invention; forming a color filter, an overcoating layer, and a microlens on the interlayer insulating layer; and removing the pad protective layer to expose the pad.

The passivation layer on the pad can be removed by dry etching.

The pad protective layer can be formed by the following process including applying the photosensitive resin composition for a pad protective layer on the entire surface of the interlayer insulating layer and exposing, and patterning the photosensitive resin composition to form a pad protective layer.

The pad protective layer can be formed using a negative type of photosensitive resin composition.

The pad protective layer can be removed by $O_2$ ashing.

The method of making an image sensor can include forming a color filter directly on the passivation layer without an overcoating layer between the passivation layer and color filter.

Hereinafter, the embodiments of the present invention will be described in detail.

According to one embodiment of the present invention, the photosensitive resin composition for a pad protective layer can provide an image sensor without the lower overcoating layer since the patterning and etching performance, and chemical resistance, are excellent. If an image sensor is produced by using a photosensitive resin composition for a pad protective layer, it is possible to decrease a phenomenon in which the photosensitivity is deteriorated or crosstalk is generated even though the pixel size of the image sensor is decreased.

DETAILED DESCRIPTION OF THE INVENTION

Figure 1:
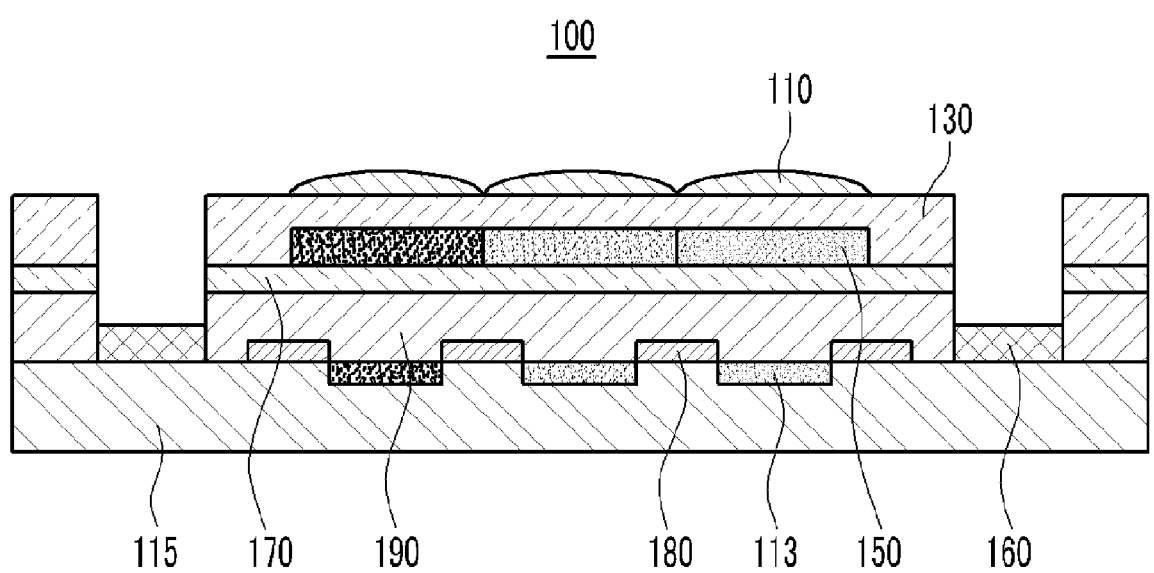
FIG. 1 is a schematic cross-sectional view showing a structure of a conventional complementary metal oxide semiconductor (CMOS) image sensor.

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements. Like numbers refer to like elements throughout the specification.

In the present application, the following reference numerals indicate the following elements in the drawings: 270: microlens; 260: overcoating layer; 250: color filter; 230: passivation layer; 210: photodiode; 201: interlayer insulating layer; 220: pad; and 240: pad protective layer.

The terminology used herein is for the purpose of describing particular embodiments only and is not intended to be limiting of the invention. It will be understood that when an element such as a layer, region or substrate is referred to as being "on" another element, it can be directly on the other element or intervening elements may also be present. In contrast, when an element is referred to as being "directly on" another element, there are no intervening elements present.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. Thus, the regions illustrated in the figures are schematic in nature and their shapes are not intended to illustrate the precise shape of a region of a device and are not intended to limit the scope of the present invention.

In the present specification, when a specific definition is not otherwise provided, the term "alkyl" refers to a C1 to C20 alkyl, the term "cycloalkyl" refers to a C3 to C30 cycloalkyl, the term "aryl" refers to a C6 to C30 aryl, the term "heteroaryl" refers to C2 to C30 heteroaryl, the term "alkoxy" refers to a C1 to C4 alkoxy, the term "alkylene" refers to a C1 to C20 alkylene, the term "cycloalkylene" refers to a C3 to C30 cycloalkylene, the term "arylene" refers to a C6 to C30 arylene, and the term "heteroarylene" refers to a C2 to C30 heteroarylene.

In the present specification, when a specific definition is not otherwise provided, the term "substituted" refers to one substituted with at least one or more substituents selected from the group consisting of halogen (F, Br, Cl, or I), hydroxy, alkoxy, nitro, cyano, amino, azido, amidino, hydrazino, hydrazono, carbonyl, carbamyl, thiol, ester, carboxyl or a salt thereof, sulfonic acid or a salt thereof, phosphoric acid or a salt thereof, alkyl, C2 to C16 alkenyl, C2 to C16 alkynyl, aryl, C7 to C13 arylalkyl, C1 to C4 oxyalkyl, C1 to C20 heteroalkyl, C3 to C20 heteroarylalkyl, cycloalkyl, C3 to C15 cycloalkenyl, C6 to C15 cycloalkynyl, heterocycloalkyl, and combinations thereof.

In the present specification, the term "hetero" refers to one including 1 to 3 heteroatoms selected from the group consisting of N, O, S, P, and combinations thereof.

The photosensitive resin composition for a pad protective layer according to one embodiment of the present invention includes (A) an alkali soluble resin, (B) a reactive unsaturated compound, (C) a photoinitiator, and (D) a solvent. The (A) alkali soluble resin includes a copolymer including about 5 to about 50 wt % of a unit having the following Chemical Formula 1, about 1 to about 25 wt % of a unit having the following Chemical Formula 2, and about 45 to about 90 wt % of a unit having the following Chemical Formula 3.

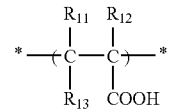

[Chemical Formula 1]

In the above Formula 1, $R_{11}$, $R_{12}$, and $R_{13}$ are each independently selected from the group consisting of hydrogen, substituted or unsubstituted alkyl, substituted or unsubstituted cycloalkyl, substituted or unsubstituted aryl, and substituted or unsubstituted heteroaryl.

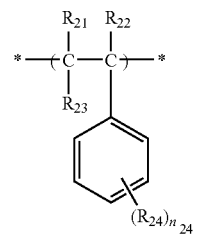

[Chemical Formula 2]

In the above Formula 2, $R_{21}$, $R_{22}$, and $R_{23}$ are each independently selected from the group consisting of hydrogen, substituted or unsubstituted alkyl, substituted or unsubstituted cycloalkyl, substituted or unsubstituted aryl, and substituted or unsubstituted heteroaryl, each $R_{24}$ is independently selected from the group consisting of substituted or unsubstituted alkyl, substituted or unsubstituted cycloalkyl, substituted or unsubstituted aryl, substituted or unsubstituted heteroaryl, and substituted or unsubstituted alkoxy, and $n_{24}$ is an integer ranging from 0 to 5.

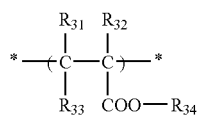

[Chemical Formula 3]

In the above Formula 3, $R_{31}$, $R_{32}$, and $R_{33}$ are each independently selected from the group consisting of hydrogen, substituted or unsubstituted alkyl, substituted or unsubstituted cycloalkyl, substituted or unsubstituted aryl, and substituted or unsubstituted heteroaryl, and $R_{34}$ is selected from the group consisting of substituted or unsubstituted alkyl, substituted or unsubstituted cycloalkyl, substituted or unsubstituted aryl, and substituted or unsubstituted heteroaryl.

The photosensitive resin composition for a pad protection layer is used to form a pad protective layer, and can eliminate the need to form a lower overcoating layer such as is conventionally used before forming the color filter. The pad protective layer is patterned by lithography to provide a color filter on the exposed pixel area. The pad protective layer acts to protect the pad from a chemical material such as a developing solution used during the color filter forming process. The pad protective layer is removed after the microlens is formed. Accordingly, the photosensitive resin composition for a pad protective layer can provide an image sensor in which the lower overcoating layer is removed.

The photosensitive resin composition that can be used as a pad protection layer requires the following characteristics.

① Patterning Performance

The photosensitive resin composition for a pad protective layer ensures the appropriate level of patterning performance for the patterning process. The pad protective layer exposes the remaining area except the pad area by a patterning process. This is a region for forming red, green, and blue color filters. In the present invention, the resolution should be at least 3.0×3.0 μm.

② Etching Rate

After the pad protective layer is formed in a microlens, it is removed together with the overcoating layer. If the etching performance of the pad protective layer is insufficient, it can cause a difficulty in subsequent processes. According to one embodiment, the photosensitive resin composition for a pad protective layer has an etching speed of about 50,000 Å/min or more, and in another embodiment, an etching speed ranging from about 60,000 to about 100,000 Å/min. When the etching speed is within this range, it is possible to perform the process before or after the etching; it facilitates control of the process; and it is possible to prevent prolonging the process.

The etching performance is determined by the kind and the composition of monomer used in the alkali-soluble resin in a photosensitive resin composition. According to the present invention, the etching performance is controlled as a result of the ratio of the units represented by the above Formulae 1 to 4 of the copolymer.

③ Chemical Resistance

After the pad protective layer is patterned, the color filter forming process follows. The pad protective layer is exposed to the various chemical materials such as a developing solution and a solvent used in the process of forming the color filter. Accordingly, it is possible to use the pad protective layer when it has sufficient resistance to the chemical materials.

The photosensitive resin composition according to the present invention has excellent patterning and etching performance and chemical resistance, so that it can be used to form a pad protective layer.

Exemplary components included in a composition for a pad protective layer according to embodiments of the present invention will hereinafter be described in detail. However, these embodiments are only exemplary, and the present invention is not limited thereto.

(A) Alkali Soluble Resin

The alkali soluble resin according to one embodiment of the present invention is a copolymer including a unit represented by Chemical Formula 1, a unit represented by Chemical Formula 2, and a unit represented by Chemical Formula 3. The copolymer may be a random copolymer, an alternating copolymer, a block copolymer, or a graft copolymer.

The unit represented by Formula 1 may be derived from a carboxylic acid compound selected from the group consisting of (meth)acrylic acid, ethacrylic acid, crotonic acid, 2-pentanoic acid, and the like, and combinations thereof. (Meth) acrylic acid has good copolymerization reactivity and heat resistance and is easily available.

The unit represented by Formula 2 may be derived from a mono olefin-based compound selected from the group consisting of styrene, α-methylstyrene, m-methylstyrene, p-methylstyrene, vinyltoluene, p-methoxystyrene, p-tertbutoxystyrene, and the like, and combinations thereof.

The alkali soluble resin includes a unit represented by Formula 3 in order to improve etching and resolution properties. The unit represented by Formula 3 may include a C5 to C30 long-chain alkyl or a C8 to C25 aryl.

A unit including the long-chain alkyl or aryl may be derived from a compound selected from the group consisting of alkyl esters or aryl esters such as n-hexyl (meth)acrylate, isodecyl (meth)acrylate, lauryl (meth)acrylate, stearyl(meth)acrylate, dicyclopentanyl (meth)acrylate, benzyl (meth)acrylate, and the like; alkyl esters including a side chain such as 2-ethylhexyl (meth)acrylate, isobornyl (meth)acrylate, and the like; and combinations thereof.

The alkali soluble resin includes about 5 to about 50 wt %, for example about 10 to about 40 wt %, of a unit represented by Chemical Formula 1, about 1 to about 25 wt %, for example about 5 to about 15 wt % of a unit represented by Chemical Formula 2, and about 45 to about 90 wt %, for example about 60 to about 80 wt %, of a unit represented by Chemical Formula 3.

When the alkali soluble resin includes the unit represented by Formula 1 in an amount less than about 5 wt %, the alkali soluble resin may not sufficiently dissolve in an alkali aqueous solution and may form residues. When the alkali soluble resin includes the unit represented by Formula 1 in an amount greater than about 50 wt %, the alkali soluble resin may exhibit excessive dissolution in an alkali aqueous solution and cause loss of the pad protective layer during a development process.

When the alkali soluble resin includes the unit represented by Formula 2 in an amount less than about 1 wt %, chemical resistance may be deteriorated. When the alkali soluble resin includes the unit represented by Formula 2 in an amount greater than about 25 wt %, etching properties may be deteriorated.

When the alkali soluble resin includes the unit represented by Formula 3 in an amount less than about 45 wt %, resolution and etching properties may be deteriorated. When the alkali soluble resin includes the unit represented by Formula 3 in an amount greater than about 90 wt %, etching properties may be excessively large.

The alkali soluble resin may further include a unit represented by the following Formula 4 in order to control molecular weight and improve coating properties as needed.

[Chemical Formula 4]

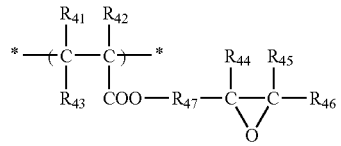

In the above Formula 4, $R_{41}$, $R_{42}$, $R_{43}$, $R_{44}$, $R_{45}$, and $R_{46}$ are each independently selected from the group consisting of hydrogen, substituted or unsubstituted alkyl, substituted or unsubstituted cycloalkyl, substituted or unsubstituted aryl, and substituted or unsubstituted heteroaryl, and $R_{47}$ is selected from the group consisting of substituted or unsubstituted alkylene, substituted or unsubstituted cycloalkylene, substituted or unsubstituted arylene, and substituted or unsubstituted heteroarylene.

The unit represented by the above Formula 4 may be derived from an epoxy compound selected from the group consisting of epoxy alkyl (meth)acrylate esters such as glycidyl (meth)acrylate, 2-methylglycidyl (meth)acrylate, 3,4-epoxybutyl (meth)acrylate, 6,7-epoxyheptyl (meth)acrylate, 3,4-epoxycyclohexyl (meth)acrylate, and the like; epoxy alkyl α-alkylacrylate esters such as glycidyl α-ethylacrylate, glycidyl α-n-propylacrylate, glycidyl α-n-butylacrylate, 6,7-epoxyheptyl α-ethylacrylate, and the like; and glycidyl ethers such as o-vinylbenzylglycidyl ether, m-vinylbenzylglycidyl ether, p-vinylbenzylglycidyl ether, and the like; and combinations thereof.

Glycidyl (meth)acrylate, 2-methylglycidyl (meth)acrylate, 6,7-epoxyheptyl (meth)acrylate, o-vinylbenzyl glycidyl ether, m-vinylbenzyl glycidyl ether, and p-vinyl benzyl glycidyl ether may be useful with regard to copolymerization reactivity and spacer strength.

The alkali soluble resin may include the unit represented by Formula 4 in an amount of about 20 wt % or less, for example about 10 wt % or less, based on the total weight of the alkali soluble resin. When the alkali soluble resin includes the unit represented by Formula 4 in an amount greater than about 20 wt %, storage stability may be deteriorated and a cured product may form before the lithography process, and thus patterns may not be formed.

The alkali soluble resin may be prepared using a copolymerization process without a modification process. For example, the alkali soluble resin may be obtained through radical polymerization of the compounds in a solvent in the presence of a catalyst (polymerization initiator).

The solvent during the polymerization may include without limitation an alcohol such as methanol, ethanol, and the like; ether such as tetrahydrofuran, and the like; cellosolve ester such as methyl cellosolve acetate, and the like; propylene glycol alkyl ether acetate such as propylene glycol methylether acetate, propylene glycol propylether acetate, and the like; aromatic hydrocarbon, ketone, ester, and the like; or a combination thereof. The solvent may be the same as the one used in the photosensitive resin composition for a pad protective layer according to one embodiment of the present invention.

The polymerization catalyst used during the radical polymerization may be a general radical polymerization initiator such as but not limited to an azo compound such as 2,2-azobis isobutyronitrile, 2,2-azobis-(2,4-dimethylvaleronitrile), 2,2-azobis-(4-methoxy-2,4-dimethylvaleronitrile), and the like; and organic peroxide and hydrogen peroxide such as benzoyl peroxide, lauroyl peroxide, t-butyl peroxy pivalate, 1,1'-bis-(t-butylperoxy)cyclohexane, and the like; and combinations thereof. When a peroxide is used as a radical polymerization initiator, it may be used in combination with a reducing agent as a redox-type initiator.

In addition, the molecular weight and the distribution of the copolymer are not specifically limited as long as it is possible to uniformly coat the photosensitive resin composition to form a pad protective layer.

According to one embodiment, the weight average molecular weight of the copolymer can range from about 15,000 to about 25,000. When the weight average molecular weight of the copolymer is less than about 15,000, the copolymer can excessively develop and lose the pattern; on the other hand, when the weight average molecular weight of the copolymer is more than about 25,000, the developing speed can be slower and the coating performance can deteriorate.

According to one embodiment, the acid value of the copolymer can range from about 70 to about 120 mg KOH/g. When the acid value of the copolymer is less than about 70 mg KOH/g, the developing speed can become slower; on the other hand, when the acid value of the copolymer is more than about 120 mg KOH/g, the copolymer can be excessively developed so as to lose the pattern.

(B) Reactive Unsaturated Compound (B) The reactive unsaturated compound according to one embodiment of the present invention is a generally-used monomer or oligomer in a photosensitive resin composition. It may be a mono-functional or multi-functional ester of (meth)acrylic acid including at least one ethylenic unsaturated double bond.

Exemplary mono-functional (meth)acrylates useful in the present invention are commercially available, for example as ARONIX M-101, ARONIX M-111, ARONIX M-114 (produced by TOAGOSEI CHEMICAL INDUSTRY CO., LTD.), KAYARAD TC-110S, KAYARAD TC-120S (produced by NIPPON KAYAKU CO., LTD.), V-158, V-2311 (produced by OSAKA ORGANIC CHEMICAL IND., LTD.), and the like.

Exemplary difunctional (meth)acrylates useful in the present invention are also commercially available, for example as ARONIX M-210, ARONIX M-240, ARONIX M-6200 (produced by TOAGOSEI CHEMICAL INDUSTRY CO., LTD.), KAYARAD HDDA, KAYARAD HX-220, KAYARAD R-604 (produced by NIPPON KAYAKU CO., LTD.), V-260, V-312, V-335 HP (produced by OSAKA ORGANIC CHEMICAL IND., LTD.), and the like.

In addition, exemplary tri- or more functional (meth)acrylates useful in the present invention may include without limitation trimethylol propane triacrylate, pentaerythritol triacrylate, tris acryloyl oxyethyl phosphate, pentaerythritol tetraacrylate, dipentaerythritol pentaacrylate, dipentaerythritol hexaacrylate, and the like, and combinations thereof. Exemplary commercially available tri- or higher functional (meth)acrylates useful in the present invention include ARONIX M-309, ARONIX M-400, ARONIX M-405, ARONIX M-450, ARONIX M-7100, ARONIX M-8030, ARONIX M-8060 (produced by TOAGOSEI CHEMICAL INDUSTRY CO., LTD.), KAYARAD TMPTA, KAYARAD DPCA-20, KAYARAD DPCA-30, KAYARAD DPCA-60, KAYARAD DPCA-120 (produced by NIPPON KAYAKU CO., LTD.), V-295, V-300, V-360, V-GPT, V-3PA, V-400 (produced by OSAKA ORGANIC CHEMICAL IND., LTD.), and the like.

The compound may be used singularly or in combination.

(C) Photoinitiator (C) The photoinitiator according to one embodiment of the present invention may include a photo-radical polymerization initiator or photo-cationic polymerization initiator, and the like, and combinations thereof.

When the photo-initiator is used, the exposure conditions should be considered. For example, any general photo-radical polymerization initiator and photo-cationic polymerization initiator can be used when the resin composition is exposed under an oxygen-free atmosphere.

Exemplary photo-radical polymerization initiators useful in the invention include without limitation: an α-diketone such as benzyl ketone, diacetyl ketone, and the like; an acyloin such as benzoin and the like; an acyloin ether such as benzoin methyl ether, benzoin ethyl ether, benzoin isopropyl ether, and the like; a benzophenone such as thioxanthone, 2,4-diethyl thioxanthone, thioxanthone-4-sulfonic acid, benzophenone, 4,4'-bis(dimethylamino)benzophenone, 4,4'-bis(diethylamino)benzophenone, and the like; an acetophenone such as acetophenone, p-dimethylaminoacetophenone, α,α'- dimethoxy acetoxy benzophenone, 2,2'-dimethoxy-2-phenylacetophenone, p-methoxyacetophenone, 2-methyl[4-(methylthio)phenyl]-2-morpholino-1-propanone, 2-benzyl-2-dimethylamino-1-(4-morpholinophenyl)-butan-1-one and the like; a quinone such as anthraquinone, 1,4-naphtoquinone, and the like; a halogen compound such as phenacyl chloride, tribromomethylphenylsulfone, tris(trichloromethyl)-s-triazine, and the like; a peroxide such as di-t-butyl peroxide, and the like; or an acyl phosphine oxide such as 2,4,6-trimethyl benzoyl diphenyl phosphine oxide and the like; and combinations thereof.

Exemplary photo-cationic polymerization initiators useful in the present invention may include without limitation commercially available initiators such as diazonium salt of Adeca ultra-set PP-33 (produced by ASAHI DENKA KOGYO KABUSHIKI KAISHA), sulfonate of OPTOMER SP-150, OPTOMER SP-170 (produced by ASAHI DENKA KOGYO KABUSHIKI KAISHA), a metallocene compound of IRGACURE 261 (produced by CIBA GEIGY AG), and the like, and combinations thereof.

Photo-radical polymerization initiators exposed under the presence of oxygen can deteriorate the sensitivity of radicals due to oxygen, which can result in an insufficient remaining rate and hardness of exposed parts. Accordingly, when the resin composition is exposed under the presence of oxygen, the above-mentioned photo-polymerization initiator can include ① all photo-cationic polymerization initiators (photo-cationic polymerization initiators rarely deteriorate the sensitivity of activating species due to oxygen), and ② a part of photo-radical polymerization initiator, for example an acetophenone such as 2-methyl-[4-(methylthio)phenyl]-2-morpholino-1-propanone, 2-benzyl-2-dimethylamino-1-(4-morpholinophenyl)-butan-1-one, a halogen compound such as phenacylchloride, tribromomethylphenylsulfone, tris (trichloromethyl)-s-triazine, and an acylphosphine oxide such as 2,4,6-trimethyl benzoyl diphenyl phosphine oxide.

The photo-radical polymerization initiator and the photo-cationic polymerization initiator absorb the light to be excited, so as to transmit energy. They can be used together with a photo-sensitizer to generate a chemical reaction.

(D) Solvent (D) The solvent according to one embodiment of the present invention should have compatibility with the copolymer, but it does not react with the copolymer.

Exemplary solvents useful in the present invention include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactate esters such as methyl lactate, ethyl lactate, and the like; alkyl oxyacetate esters such as methyl oxyacetate, ethyl oxyacetate, butyl oxyacetate, and the like; alkyl alkoxy acetate esters such as methyl methoxy acetate, ethyl methoxy acetate, butyl methoxy acetate, methyl ethoxy acetate, ethyl ethoxy acetate, and the like; 3-oxy propionate alkylesters such as 3-oxy methyl propionate, 3-oxy ethyl propionate, and the like; 3-alkoxy propionate alkyl esters such as 3-methoxy methyl propionate, 3-methoxy ethyl propionate, 3-ethoxy ethyl propionate, 3-ethoxy methyl propionate, and the like; 2-oxy propionate alkyl esters such as 2-oxy methyl propionate, 2-oxy ethyl propionate, 2-oxy propyl propionate, and the like; 2-alkoxy propionate alkyl esters such as 2-methoxy methyl propionate, 2-methoxy ethyl propionate, 2-ethoxy ethyl propionate, 2-ethoxy methyl propionate, and the like; 2-oxy-2-methyl propionate esters such as 2-oxy-2-methyl methyl propionate, 2-oxy-2-methyl ethyl propionate, and the like; monooxy monocarboxylate alkyl esters such as 2-alkoxy-2-methyl propionate alkyls such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, ethyl hydroxy acetate, 2-hydroxy-3-methyl methyl butanoate, and the like; and ketonate esters such as ethyl pyruvate and the like; and combinations thereof. Additionally, the following high-boiling point solvents may be further added: N-methylformamide, N,N-dimethyl formamide, N-methylformanylide, N-methylacetamide, N,N-dimethyl acetamide, N-methylpyrrolidone, dimethylsulfoxide, benzylethylether, dihexylether, acethylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, carbonate ethylene, carbonate propylene, phenyl cellosolve acetate, and the like, and combinations thereof.

The following solvents selected may be selected based on compatibility and reactivity: glycol ethers such as ethylene glycol monoethyl ether, and the like; ethylene glycol alkylether acetates such as ethyl cellosolve acetate, and the like; esters such as 2-hydroxy ethyl propionate, and the like; diethylene glycols such as diethylene glycol monomethyl ether, and the like; and propylene glycols and alkylether acetates such as propylene glycol methylether acetate, propylene glycol propylether acetate, and the like; and combinations thereof.

(E) Other Additives

According to one embodiment of the present invention, a photosensitive resin composition for a pad protective layer may further include a silane coupling agent having a reactive substituent such as a carboxyl group, a methacryloyl group, an isocyanate group, an epoxy group, and the like.

Examples of the silane coupling agent useful in the invention may include without limitation trimethoxysilyl benzoic acid, γ-methacryl oxypropyl trimethoxysilane, vinyl triacetoxy silane, vinyl trimethoxysilane, γ-iso cyanate propyl triethoxysilane, γ-glycidoxy propyl trimethoxysilane, β-(3,4-epoxycyclohexyl)ethyltrimethoxy silane, and the like. The silane coupling agents may be used singularly or in combination of at least two.

According to one embodiment, the silane coupling agent may be added in an amount of about 0.001 to about 20 parts by weight based on 100 parts by weight of alkali soluble resin.

The photosensitive resin composition for a pad protective layer according to one embodiment of the present invention may further include a surfactant to improve the coating performance and to prevent defects as required.

For example, exemplary surfactants useful in the presenting invention may include without limitation fluorine-based surfactants commercially available under the name of BM-1000, BM-1100 (produced by BM Chemie), MEGAFACE F 142D, MEGAFACE F 172, MEGAFACE F 173, MEGAFACE F 183 (produced by DAINIPPON INK & CHEMICALS, INC.), FULORAD FC-135, FULORAD FC-170C, FULORAD FC-430, FULORAD FC-431 (produced by Sumitomo 3M Limited), SURFLON S-112, SURFLON S-113, SURFLON S-131, SURFLON S-141, SURFLON S-145 (produced by ASAHI GLASS CO., LTD.), SH-28PA, SH-190, SH-193, SZ-6032, SF-8428 (produced by TORAY SILICONE CO., LTD.), and the like, and combinations thereof.

The surfactant may be added in an amount of about 0.001 to about 5 parts by weight, based on 100 parts by weight of alkali soluble resin.

The photosensitive resin composition for a pad protective layer according to one embodiment of the present invention may further include other ingredients as required, as long as the other ingredient(s) do not inhibit or interfere with the function of the present invention.

The photosensitive resin composition may include (A) about 1 to about 50 wt % of an alkali soluble resin, (B) about 1 to about 50 wt % of a reactive unsaturated compound, (C) about 0.1 to about 15 wt % of a photo-initiator, and (D) the balance of solvent. According to another embodiment, the solvent may be added in an amount of about 1 to about 95 wt %. According to a further embodiment, the photosensitive resin composition may further include (A) about 10 to about 30 wt % of an alkali soluble resin, (B) about 3 to about 30 wt % of a reactive unsaturated compound, (C) about 1 to about 10 wt % of a photo-initiator, and (D) the balance of solvent. In a further embodiment, the solvent is added in an amount of about 1 to about 85 wt %.

When the alkali soluble resin is present in the resin composition of the invention in an amount less than about 1 wt %, the pattern may not be well formed; on the other hand, when the alkali soluble resin is present in the resin composition of the invention in an amount greater than about 50 wt %, the viscosity of composition can sufficiently increase to deteriorate processability and leave a residue.

When the reactive unsaturated compound is present in the resin composition of the invention in an amount less than about 1 wt %, the sensitivity of the resin can easily deteriorate under the presence of oxygen; on the other hand, when the reactive unsaturated compound is present in the resin composition of the invention in an amount greater than about 50 wt %, the compatibility with the copolymer can deteriorate, so that the coating surface may become rougher after forming the coating film.

When the photo-initiator is present in the resin composition of the invention in an amount less than about 0.1 wt %, the radical sensitivity can easily deteriorate due to oxygen; on the other hand, when the photo-initiator is present in the resin composition of the invention in an amount greater than about 15 wt %, the color concentration of the solution can increase excessively or it could be precipitated.

A method of making an image sensor according to another embodiment of the present invention includes: forming a photodiode, a pad, and a passivation layer on an interlayer insulating layer and removing the passivation layer on the pad to expose the pad; forming a pad protective layer on the exposed pad using the photosensitive resin composition; forming a color filter, an overcoating layer, and a microlens on the interlayer insulating layer; and removing the pad protective layer to expose the pad.

Figure 2:
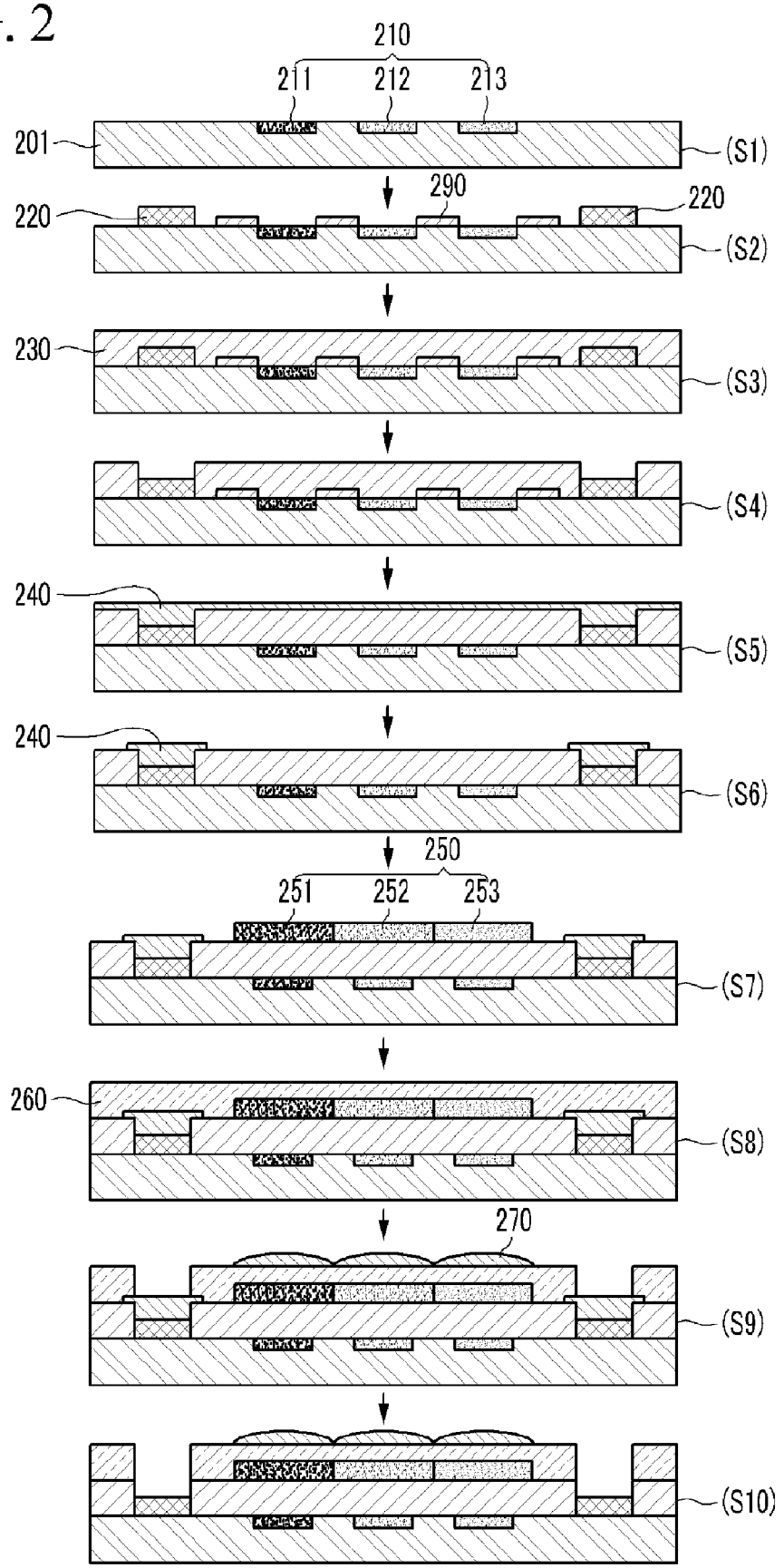
FIG. 2 shows a method of making an image sensor according to one embodiment of the present invention.

Hereinafter, a method of producing an image sensor according to another embodiment of the present invention is described with reference to the drawings. FIG. 2 is a drawing showing a method of producing the image sensor according to one embodiment of the present invention.

First, a photodiode 210 of red 211, blue 212, and green 213 is formed on an interlayer insulating layer 201 (S1). A pad 220 and a metal layer 290 are formed on the interlayer insulating layer 201 (S2). A passivation layer 230 is formed on the surface of interlayer insulating layer 201 to cover the photodiode 210 and the pad 220 (S3). The passivation layer 230 formed on the pad 220 is removed by any method such as dry etching, so that the pad 220 is exposed (S4).

A pad protective layer 240 is formed using a photosensitive resin composition on the exposed pad 220 (S5). According to one embodiment, the photosensitive resin composition is a photosensitive resin composition for a pad protective layer according to one embodiment of the present invention. The pad protective layer 240 is prepared by coating a photosensitive resin composition for a pad protective layer on the surface of the interlayer insulating layer 201, irradiating the photosensitive resin composition with light with a certain pattern to form a pad protective layer, and developing the layer with an alkali developing solution to remove regions of the pad protective layer 240 other than the regions at the exposed pad 220 (S6). According to one embodiment, the pad protective layer 240 is produced using a negative-type photosensitive method.

A photosensitive resin composition for a color filter is coated on the surface of the interlayer insulating layer 201 formed with the pad protective layer 240, and the resin composition layer is irradiated to form the pattern required for the color filter. The resin composition layer is then treated with an alkali developing solution to dissolving the non-exposed regions to form a color filter 250 including red 251, blue 252, and green 253 portions having a pattern required for the color filter (S7).

An overcoating layer 260 is formed on the surface of interlayer insulating layer 201 formed with the color filter 250 (S8), and a microlens 270 is formed on the overcoating layer 260 (S9).

The overcoating layer 260 formed on the pad is patterned and removed, and the pad protective layer 240 is removed to expose the pad, so as to provide an image sensor (S10). Removal of the pad protective layer 240 may be performed with an $O_2$ ashing method, but it is not limited thereto.

When the image sensor is made according to one embodiment of the present invention, it is possible to form a color filter 250 directly on the passivation layer 230 instead of forming an overcoating layer between the passivation layer 230 and the color filter 250. According to the method of another embodiment, it is possible to provide an image sensor for high resolution having a pixel size of 1.0 µm or less in which it is possible to prevent deterioration of the photosensitivity by minimizing the distance from the microlens to the photodiode; and that it is also possible to prevent damage of the pad from the after process by introducing the pad protective layer.

Figure 3:
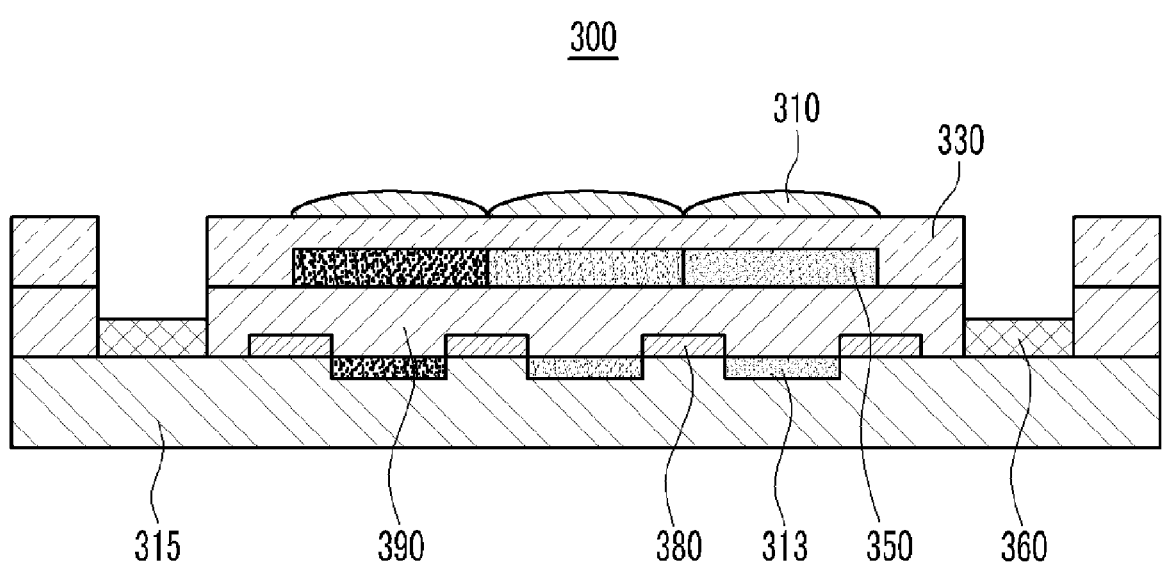
FIG. 3 is a schematic cross-sectional view of a complementary metal oxide semiconductor image sensor made according to a method of making of an image sensor according to one embodiment of the present invention.

FIG. 3 is a schematic cross-sectional view of a structure of a complementary metal oxide semiconductor (CMOS) type of image sensor 300 made by the method of making an image sensor according to another embodiment. Referring to FIG. 3, the out-going light reaches a color filter 350 through a microlens 310 and an overcoating layer 330; it is separated into each R, G, and B colors at the color filter 350; and is transmitted to a photodiode 313 corresponding to each pixel formed between metal layers 380 on an interlayer insulating layer 315 through the passivation layer 390. A pad 360 is connected to the photodiode 313 for drawing the signal from the image sensor 300.

As compared to the conventional image sensor 100 shown in FIG. 1, the image sensor 300 shown in FIG. 3 has no overcoating layer 170 between a passivation layer 390 and the color filter 350, and the color filter 350 is formed directly on the passivation layer 390.

The following examples illustrate the present invention in more detail. These examples, however, should not in any sense be interpreted as limiting the scope of the present invention.

Indeed, descriptions that are not included in this specification are omitted because they can be easily understood by one having ordinary skill in the art without any difficulty.

(Preparation of Alkali Soluble Resin)

Synthesis Example 1

| (1) Monomer with a unit represented by Chemical Formula 1 | | |
|---|---|---|
| Methacrylic acid | 15 | g |
| (2) Monomer with a unit represented by Chemical Formula 2 | | |
| Styrene | 10 | g |
| (3) Monomer with a unit represented by Chemical Formula 3 | | |
| Dicyclopentanyl methacrylate | 75 | g |
| (4) Radical polymerization catalyst | | |
| 2,2'-azobis (2,4-dimethyl valeronitrile) | 10 | g |
| (5) Solvent | | |
| Propylene glycol monomethyl ether acetate | 208.76 | g |

Air is substituted with nitrogen in a flask mounted with an agitator, a reflux condenser, a drying tunnel, a nitrogen introducer, a thermometer, and a circulator capable of controlling temperature to provide a nitrogen atmosphere, then the above-mentioned materials are added into the flask.

The flask is immersed in a oil bath and polymerization takes place at a reaction temperature of 70° C. for 3 hours with agitation to provide an alkali soluble resin (hereinafter referred to as "copolymer 1") having a molecular weight (Mw) of 20,000.

Synthesis Examples 2 to 10

Alkali soluble resins (hereinafter referred to as "copolymers 2 to 10") are prepared in accordance with the same procedure as in Synthesis Example 1, except that the kind and amount of the monomer are changed.

The kind and amount of the monomers in Synthesis Examples 1 to 10, the acid value, and the molecular weight of the copolymers are shown in the following Table 1.

TABLE 1

| | Monomer (wt %) | | | | | | | copolymer | |
|---|---|---|---|---|---|---|---|---|---|
| | MAA | ST | DCM | IBMA | BzMA | SMA | GMA | Acid value (mgKOH/g) | Molecular weight (Mw) |
| Synthesis Example 1 | 15 | 10 | 75 | — | — | — | — | 95 | 20000 |
| Synthesis Example 2 | 15 | 10 | — | 75 | — | — | — | 95 | 20000 |
| Synthesis Example 3 | 15 | 10 | — | — | 75 | — | — | 95 | 23000 |
| Synthesis Example 4 | 15 | 10 | — | — | — | 75 | — | 95 | 23000 |
| Synthesis Example 5 | 15 | 10 | 15 | 15 | 5 | 40 | — | 95 | 24000 |
| Synthesis Example 6 | 15 | 20 | 15 | 15 | 5 | 30 | — | 95 | 25000 |
| Synthesis Example 7 | 15 | 5 | 15 | 15 | 5 | 40 | 5 | 95 | 22000 |
| Synthesis Example 8 | 15 | 5 | 15 | 15 | 15 | 40 | — | 95 | 24000 |
| Synthesis Example 9 | 15 | 10 | 15 | 15 | 5 | 40 | 5 | 95 | 25000 |
| Synthesis Example 10 | 5 | 10 | 15 | 15 | 5 | 50 | — | 50 | 25000 |

(1) Monomer with a unit represented by Chemical Formula 1
Methacrylic acid (MAA)
(2) Monomer with a unit represented by Chemical Formula 2
Styrene (ST)
(3) Monomer with a unit represented by Chemical Formula 3
Dicyclopentanyl methacrylate (DCM)
Isobornyl methacrylate (IBMA)
Benzyl methacrylate (BzMA)
Stearyl methacrylate (SMA)
(4) Monomer with a unit represented by Chemical Formula 1
Glycidyl methacrylate (GMA)

(Preparation of Photosensitive Resin Composition)

Example 1

A photosensitive resin composition shown in the following Table 2 is prepared by using copolymer 1 obtained from Synthesis Example 1.

TABLE 2

| | Component | Content (g) |
|---|---|---|
| Alkali soluble resin | copolymer 1 | 15.0 |
| Reactive unsaturated compound | dipentaerythritolhexaacrylate | 16.5 |
| Photoinitiator | IGR 369 (produced by Ciba-Geigy Corporation) | 4.0 |
| Solvent | propyleneglycol methyletheracetate | 63.71 |
| Other additive | γ-glycidoxy propyl trimethoxysilane (S-510, produced by Chisso Corporation) | 0.79 |

* the content of the copolymer 1 is based on solid content.

Examples 2 to 10

Resin compositions are prepared in accordance with the same procedure as in Example 1, except that each of the copolymers 2 to 10 obtained from Synthesis Examples 2 to 10 is used as an alkali soluble resin.

Reference Example 1

A photosensitive resin composition is prepared in accordance with the same procedure as in Example 1, except that 15.0 g of a copolymer of benzylmethacrylate (A)/methacrylic acid (B) (A/B=75/25 (wt %), Mw=25,000) is used as an alkali soluble resin.

Performance Assessment of Pad Protective Layer (1) Forming Pad Protective Layer

Each of the photosensitive resin compositions obtained from Examples 1 to 10 and Reference Example 1 is coated on an 8-inch wafer formed with a photodiode and a pad using a spin coater (1H-DX2, produced by MIKASA) and dried at 100° C. for 180 seconds to provide a coating film.

Light having a wavelength of 365 nm is irradiated onto the obtained coating films at 500 ms by an I-line stepper (NSR i10C, produced by NIKON) mounted with a reticle having various-sized patterns. The films are developed with an aqueous solution in which tetra methyl ammonium hydroxide (TMAH) is diluted at 0.19 wt % at 23° C. for 2 minutes and cleaned with pure water for 1 minute.

The wafer is heated at 200° C. for 180 seconds in a oven and cured to provide a pad protective layer pattern.

(2) Performance Assessment of Pad Protective Layer (i) Measuring Patterning Performance The obtained pad protective layer is observed through a scanning electron microscope (SEM) to determine ⊚ for a good square shape, ○ for a slightly round shape, and X for a complete round shape. The assessing results are shown in the following Table 3.

(ii) Measuring Etching Performance

The pad protective layer is treated under an $O_2$ plasma condition for 1 minute, and the thickness change is measured with ST4000-DLX equipment (manufactured by KMAC). The assessment results are shown in the following Table 3.

(iii) Measuring Chemical Resistance

The pattern protective layer is input into each of TMAH (2.35%), isopropyl alcohol (IPA), propylene glycol monomethyl ether acetate (PGMEA), and acetone for 1 minute. The thickness change is measured by using KST4000-DLX equipment (manufactured by KMAC), and the assessment results are shown in the following Table 3.

TABLE 3

| | Patterning Performance | Etching performance (Å/min) | Chemical resistance (thickness difference between before and after treatment, Å/min) | | | |
|---|---|---|---|---|---|---|
| | | | TMAH | IPA | PGMEA | acetone |
| Example 1 | ○ | 45400 | 3.1 | 1.2 | 12.1 | 10.0 |
| Example 2 | ○ | 47800 | 1.3 | 2.6 | 12.2 | 12.0 |
| Example 3 | ○ | 54000 | 1.4 | 1.6 | 7.2 | 8.0 |
| Example 4 | ⊚ | 65000 | 1.0 | 0.6 | 1.0 | 24.0 |
| Example 5 | ⊚ | 74000 | 0.5 | 0.6 | 2.1 | 2.0 |
| Example 6 | ⊚ | 9000 | 0.5 | 3.5 | 10.8 | 87.0 |
| Example 7 | ⊚ | 121000 | 0.3 | 0.2 | 1.2 | 0.3 |
| Example 8 | ⊚ | 69200 | 0.3 | 0.2 | 1.4 | 1.0 |
| Example 9 | ⊚ | 65500 | 0.2 | 0.3 | 1.1 | 0.6 |
| Example 10 | ⊚ | 67100 | 0.3 | 1.4 | 0.5 | 2.0 |
| Reference Example 1 | X | 3000 | 5.5 | 8.4 | 15.8 | 60.5 |

Referring to Table 3, the pattern protective layers obtained from Examples 1 to 10 have good patterning and etching performance and chemical resistance superior to those of Reference Example 1.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for a pad protective layer, comprising:
(A) an alkali soluble resin, (B) a reactive unsaturated compound, (C) a photoinitiator, and (D) a solvent, wherein the (A) alkali soluble resin includes a copolymer including about 5 to about 50 wt % of a unit represented by Chemical Formula 1, about 1 to about 25 wt % of a unit represented by Chemical Formula 2, and about 45 to about 90 wt % of a unit represented by Chemical Formula 3, and wherein the total weight of the units represented by Chemical Formulae 2 and 3 is greater than 70 wt %:

[Chemical Formula 1]

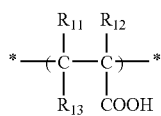

wherein in the above Formula 1, $R_{11}$, $R_{12}$, and $R_{13}$ are each independently selected from the group consisting of hydrogen, substituted or unsubstituted alkyl, substituted or unsubstituted cycloalkyl, substituted or unsubstituted aryl, and substituted or unsubstituted heteroaryl;

[Chemical Formula 2]

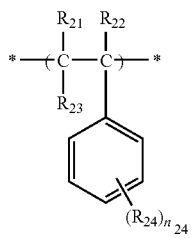

wherein in the above Formula 2, $R_{21}$, $R_{22}$, and $R_{23}$ are each independently selected from the group consisting of hydrogen, substituted or unsubstituted alkyl, substituted or unsubstituted cycloalkyl, substituted or unsubstituted aryl, and substituted or unsubstituted heteroaryl, each $R_{24}$ is independently selected from the group consisting of substituted or unsubstituted alkyl, substituted or unsubstituted cycloalkyl, substituted or unsubstituted aryl, substituted or unsubstituted heteroaryl, and substituted or unsubstituted alkoxy, and $n_{24}$ is an integer ranging from 0 to 5; and

[Chemical Formula 3]

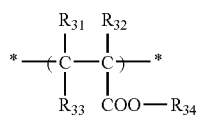

wherein in the above Formula 3, $R_{31}$, $R_{32}$, and $R_{33}$ are each independently selected from the group consisting of hydrogen, substituted or unsubstituted alkyl, substituted or unsubstituted cycloalkyl, substituted or unsubstituted aryl, and substituted or unsubstituted heteroaryl, and $R_{34}$ is selected from the group consisting of substituted or unsubstituted alkyl, substituted or unsubstituted cycloalkyl, substituted or unsubstituted aryl, and substituted or unsubstituted heteroaryl.

2. The photosensitive resin composition of claim 1, wherein the (A) alkali soluble resin comprises about 10 to about 40 wt % of a unit of Chemical Formula 1, about 5 to about 15 wt % of a unit of Chemical Formula 2, and about 60 to about 80 wt % of a unit of Chemical Formula 3.

3. The photosensitive resin composition of claim 1, wherein the photosensitive resin composition comprises about 1 to about 50 wt % of the (A) alkali soluble resin, about 1 to about 50 wt % of the (B) reactive unsaturated compound, (C) about 0.1 to about 15 wt % of the photoinitiator, and (D) the balance of the solvent.

4. The photosensitive resin composition of claim 1, wherein the (A) alkali soluble resin is a copolymer which further comprises a unit having the following Formula 4:

[Chemical Formula 4]

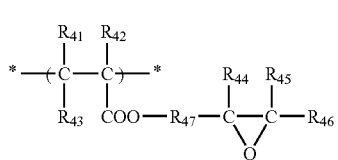

wherein in the above Formula 4, $R_{41}$, $R_{42}$, $R_{43}$, $R_{44}$, $R_{45}$, and $R_{46}$ are each independently selected from the group consisting of hydrogen, substituted or unsubstituted alkyl, substituted or unsubstituted cycloalkyl, substituted or unsubstituted aryl, and substituted or unsubstituted heteroaryl, and $R_{47}$ is selected from the group consisting of substituted or unsubstituted alkylene, substituted or unsubstituted cycloalkylene, substituted or unsubstituted arylene, and substituted or unsubstituted heteroarylene.

5. The photosensitive resin composition of claim 4, wherein the (A) alkali soluble resin comprises the unit represented by Formula 4 in an amount of about 20 wt % or less based on the total weight of the alkali soluble resin.

6. The photosensitive resin composition of claim 1, wherein the unit of Formula 2 is derived from a styrene.

7. The photosensitive resin composition of claim 1, wherein the unit of Formula 3 is derived from a compound selected from the group consisting of dicyclo pentanyl (meth) acrylate, isobornyl (meth)acrylate, stearyl (meth)acrylate, and combinations thereof.

8. An intermediate device useful for the production of an image sensor, comprising:

an insulating layer;

a photodiode, a pad, and a passivation layer on the insulating layer;

a pad protective layer on the pad formed of a photosensitive resin composition comprising an alkali soluble resin including a copolymer including about 5 to about 50 wt % of a unit represented by Chemical Formula 1, about 1 to about 25 wt % of a unit represented by Chemical Formula 2, and about 45 to about 90 wt % of a unit represented by Chemical Formula 3, and wherein the total weight of the units represented by Chemical Formulae 2 and 3 is greater than 70 wt %:

[Chemical Formula 1]

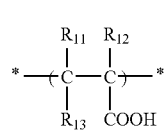

wherein in the above Formula 1, $R_{11}$, $R_{12}$, and $R_{13}$ are each independently selected from the group consisting of hydrogen, substituted or unsubstituted alkyl, substituted or unsubstituted cycloalkyl, substituted or unsubstituted aryl, and substituted or unsubstituted heteroaryl;

[Chemical Formula 2]

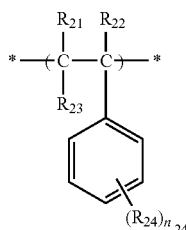

wherein in the above Formula 2, $R_{21}$, $R_{22}$, and $R_{23}$ are each independently selected from the group consisting of hydrogen, substituted or unsubstituted alkyl, substituted or unsubstituted cycloalkyl, substituted or unsubstituted aryl, and substituted or unsubstituted heteroaryl, each $R_{24}$ is independently selected from the group consisting of substituted or unsubstituted alkyl, substituted or unsubstituted cycloalkyl, substituted or unsubstituted aryl, substituted or unsubstituted heteroaryl, and substituted or unsubstituted alkoxy, and $n_{24}$ is an integer ranging from 0 to 5; and

[Chemical Formula 3]

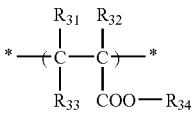

wherein in the above Formula 3, $R_{31}$, $R_{32}$, and $R_{33}$ are each independently selected from the group consisting of hydrogen, substituted or unsubstituted alkyl, substituted or unsubstituted cycloalkyl, substituted or unsubstituted aryl, and substituted or unsubstituted heteroaryl, and $R_{34}$ is selected from the group consisting of substituted or unsubstituted alkyl, substituted or unsubstituted cycloalkyl, substituted or unsubstituted aryl, and substituted or unsubstituted heteroaryl;

a color filter on the passivation layer;

an overcoating layer on the color filter; and a microlens on the overcoating layer.

9. The device of claim 8, wherein the color filter is directly on the passivation layer without a second overcoating layer between the passivation layer and the color filter.

10. The photosensitive resin composition of claim 1, wherein the total weight of the units represented by Chemical Formulae 2 and 3 is at least 75 wt %.

11. The photosensitive resin composition of claim 10, wherein the total weight of the units represented by Chemical Formulae 2 and 3 is 75 to 95 wt %.

12. The photosensitive resin composition of claim 11, wherein the total weight of the units represented by Chemical Formulae 2 and 3 is 80 to 95 wt %.

13. The photosensitive resin composition of claim 5, wherein the (A) alkali soluble resin comprises the unit represented by Formula 4 in an amount of less than 10 wt % based on the total weight of the alkali soluble resin.

14. The photosensitive resin composition of claim 13, wherein the (A) alkali soluble resin comprises the unit represented by Formula 4 in an amount of 5 wt % or less based on the total weight of the alkali soluble resin.

15. The photosensitive resin composition of claim 13, wherein the total weight of the units represented by Chemical Formulae 2 and 3 is 80 to 95 wt %.

\* \* \* \* \*